(12) United States Patent
Yamaguchi et al.

(10) Patent No.: US 6,669,869 B2
(45) Date of Patent: Dec. 30, 2003

(54) ANISOTROPIC CONDUCTIVE FILM

(75) Inventors: Miho Yamaguchi, Ibaraki (JP); Sadahito Misumi, Ibaraki (JP); Yuji Hotta, Ibaraki (JP)

(73) Assignee: Nitto Denko Corporation, Ibaraki (JP)

( * ) Notice: Subject to any disclaimer, the term of this patent is extended or adjusted under 35 U.S.C. 154(b) by 120 days.

(21) Appl. No.: 10/100,622

(22) Filed: Mar. 18, 2002

(65) Prior Publication Data

US 2002/0130302 A1 Sep. 19, 2002

(30) Foreign Application Priority Data

Mar. 19, 2001 (JP) ........................................ 2001-078456

(51) Int. Cl.$^7$ ................................ H01B 1/22; H01R 4/58
(52) U.S. Cl. .................... 252/512; 252/514; 439/91; 174/258
(58) Field of Search ............................. 252/512, 514; 174/258, 259; 438/119; 439/91

(56) References Cited

U.S. PATENT DOCUMENTS 6,245,175 B1    6/2001   Hotta et al.
6,394,821 B1 *  5/2002   Matsumura et al. .......... 439/91

2001/0032733 A1 10/2001 Yamaguchi et al.

FOREIGN PATENT DOCUMENTS

WO       WO 98/07216         2/1998

\* cited by examiner

*Primary Examiner*—Mark Kopec
(74) *Attorney, Agent, or Firm*—Leydig, Voit & Mayer, Ltd.

(57) ABSTRACT

As an anisotropic conductive film capable of firmly adhering to an electronic component and a circuit board and achieving good electrical continuity by thermal compression bonding at a low temperature at which the circuit board is not deteriorated, an anisotropic conductive film is provided, which has a plurality of conductive paths 2 insulated from each other and penetrating the film substrate 1A in the direction of the thickness of the film substrate, both ends 2a and 2b of each conductive path being exposed to the top and back faces of the film substrate, wherein the film substrate 1A is mainly composed of a polycarbodiimide copolymer having a structure represented by formula (I) below:

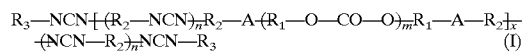

wherein m represents an integer of 2–50; n represents an integer of 1–30; x represents an integer of 1–10; A represents a urethane bond; $R_1$ represents an alkylene group; $R_2$ represents an aromatic diisocyanate residue; and $R_3$ represents an aromatic monoisocyanate residue.

14 Claims, 5 Drawing Sheets longitudinal direction of core member

ANISOTROPIC CONDUCTIVE FILM

FIELD OF THE INVENTION

The present invention relates to an anisotropic conductive film, and more specifically to an anisotropic conductive film comprising a polycarbodiimide copolymer as a material of a film substrate.

BACKGROUND OF THE INVENTION

In recent years, anisotropic conductive films have been widely used as connector materials to electrically connect electronic components, such as a semiconductor element (IC chip), and circuit boards.

Conventionally-known anisotropic conductive films are formed by dispersing conductive microparticles in a film substrate made of an insulating resin. However, this type of anisotropic conductive film poses structure-related problems, including difficulty in fine pitch connection with the connection target and necessity for a convex (bumpy) terminal of the connection target, e.g., electrode of semiconductor element. Accordingly, WO98/07216 proposes an anisotropic conductive film having a plurality of conductive paths insulated from each other and penetrating a film substrate made of an insulating resin in the thickness direction of the film substrate, as an anisotropic conductive film capable of solving these problems and permitting fine pitch and bumpless structures.

Anisotropic conductive films are normally used for two purposes. One is the use as a so-called mounting connector, wherein an anisotropic conductive film is placed between an electronic component and a circuit board and thermally compression-bonded to the both, thereby to electrically and mechanically connect the electronic component and the circuit board. The other is the use as a so-called testing connector that enables a functional test of an electronic component, wherein an anisotropic conductive film is inserted between the electronic component and a circuit board, and pressure connected to the both to ensure electrical continuity between the electronic component and the circuit board.

An anisotropic conductive film is used as a testing connector to avoid poor yields and increased costs of circuit board, which occur when a functional test of an electronic component is conducted after mounting the electronic component on a circuit board, because a combination of a faulty electronic component and a good circuit board is wasted as being useless.

When an electronic component (semiconductor element or the like) is mounted on a circuit board using an anisotropic conductive film, good electrical continuity between the electronic component and the circuit board cannot be achieved unless the film substrate of the anisotropic conductive film softens or melts sufficiently to firmly adhere to both the electronic component and the circuit board. In recent years, an increasing number of film substrates composed of a polycarbodiimide resin have been used as an anisotropic conductive film for a mounting connector. The reasons for this are low water absorption of polycarbodiimide resin, highly reliable moisture resistance of an anisotropic conductive film employing a polycarbodiimide resin as a film substrate and possible storage thereof at normal temperature. However, the film substrate (polycarbodiimide resin) of said anisotropic conductive film is softened or becomes molten sufficiently only by thermal compression bonding at a temperature of 250° C. or higher. On the other hand, it has been found that a base substrate (resin substrate) of a circuit board of a semiconductor device (finished product with a semiconductor element mounted on the circuit board), obtained by thermal compression bonding at such a temperature is deteriorated and discolored, and causes connection failure between said semiconductor device and the mother board.

For performance inspection of electronic components, a functional test (burn-in test) may be conducted at a high temperature of 150° C. or higher to assess the function of the electronic components when they generated heat during actual operation. However, almost all the conventional anisotropic conductive films do not have heat resistance to endure high temperatures of 150° C. or higher. As a result, the film substrate may soften or melt, partly adhering to a circuit board (testing tool), and prevent continuous testing. In other words, the circuit board may be no longer available for repeated use as a testing tool.

An example of an anisotropic conductive film having superior heat resistance is one having a film substrate formed with silicone rubber. In a test using such an anisotropic conductive film at a temperature of 150° C. or higher, however, gaseous silicon may be generated from the film substrate and contaminate the electronic component and/or the circuit board to prevent electrical continuity during the test, or the Si component may adhere to the electronic component (semiconductor element) and/or the circuit board to cause an error.

SUMMARY OF THE INVENTION

In view of the above circumstances, it is a first object of the present invention to provide an anisotropic conductive film capable of ensuring good electrical continuity between an electronic component and a circuit board by thermal compression bonding at a low temperature at which the circuit board is not deteriorated. It is a second object of the present invention to provide an anisotropic conductive film wherein, in a functional test of an electronic component at a temperature of 150° C. or higher, its film substrate does not adhere to the electronic component or a circuit board, the film ensures electrical continuity between the electronic component and the circuit board with a relatively low pressure (low load), and the film does not generate an out-gas.

With the aim of accomplishing the above objects, the present inventors conducted extensive investigations and found that a polycarbodiimide copolymer, wherein a polyalkylene carbonate unit is introduced to the polycarbodiimide molecule, is capable of softening or melting at relatively low temperatures without affecting the excellently low water absorption of a polycarbodiimide resin, that an anisotropic conductive film comprising a film substrate composed of this copolymer can adhere to both an electronic component and a circuit board at relatively low temperatures by thermal compression, that a thermal setting product of said copolymer possesses heat resistance to temperatures of 150° C. or higher and is relatively flexible, and that an anisotropic conductive film comprising a film substrate composed of this thermal setting product is capable of ensuring electrical continuity between the electronic component and the circuit board simply by press adhering the film to the electronic component and the circuit board with a relatively low pressure (low load), thereby enabling testing of the both.

Accordingly, the present invention provides the following:

(1) An anisotropic conductive film comprising a film substrate made of an insulating resin and a plurality of conductive paths insulated from each other and penetrating the film substrate in the direction of thickness, wherein said film substrate is mainly composed of a polycarbodiimide copolymer having a structure represented by the formula (I) below:

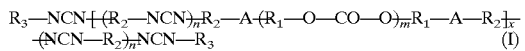

wherein m represents an integer of 2–50; n represents an integer of 1–30; x represents an integer of 1–10; A represents a urethane bond; $R_1$ represents an alkylene group; $R_2$ represents an aromatic diisocyanate residue; and $R_3$ represents an aromatic monoisocyanate residue.

(2) The anisotropic conductive film of (1) above, wherein the polycarbodiimide copolymer has a glass transition temperature of 50–150° C.

(3) The anisotropic conductive film of (1) above, wherein, in the formula (I), the alkylene group represented by $R_1$ is a hexamethylene group, the aromatic diisocyanate residue represented by $R_2$ is a tolylene diisocyanate residue, and the aromatic monoisocyanate residue represented by $R_3$ is a p-isopropylphenyl isocyanate residue.

(4) The anisotropic conductive film of any of (1) through (3) above, which is used for mounting an electronic component, and which is disposed between an electronic component and a circuit board and bonded to allow adhesion to the both by thermal compression, so that said electronic component and the circuit board are mechanically and electrically connected.

(5) An anisotropic conductive film comprising a film substrate and a plurality of conductive paths insulated from each other and penetrating the film substrate in the direction of thickness, wherein said film substrate is mainly composed of a setting product of a polycarbodiimide copolymer having a structure represented by formula (I) below

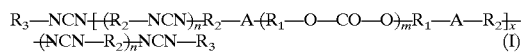

wherein m represents an integer of 2–50; n represents an integer of 1–30; x represents an integer of 1–10; A represents a urethane bond; $R_1$ represents an alkylene group; $R_2$ represents an aromatic diisocyanate residue; and $R_3$ represents an aromatic monoisocyanate residue.

(6) The anisotropic conductive film of (5) above, wherein the polycarbodiimide copolymer setting product has a glass transition temperature of 150–250° C.

(7) The anisotropic conductive film of (5) above, wherein, in the formula (I), the alkylene group represented by $R_1$ is a hexamethylene group, the aromatic diisocyanate residue represented by $R_2$ is a tolylene diisocyanate residue, and the aromatic monoisocyanate residue represented by $R_3$ is a p-isopropylphenyl isocyanate residue.

(8) The anisotropic conductive film of (5) above, wherein the film as a whole has an elastic modulus of 1 to 1000 MPa at 150° C. to 250° C.

(9) The anisotropic conductive film of any of (5) through (8) above, which is used for functional testing of an electronic component, and which is inserted between the electronic component and a circuit board and adhered to the both by compression, so that said electronic component and the circuit board are testably conducted with each other.

BRIEF DESCRIPTION OF THE DRAWINGS

FIG. 1 shows an example of an anisotropic conductive film according to a first embodiment of the present invention.

FIG. 3 shows a laminate wherein a winding layer comprising an insulated lead wire and an insulating resin film are laminated alternately, which laminate is obtained after the step of FIG. 2 in the production of the anisotropic conductive film of the present invention.

FIG. 4 shows an example of an anisotropic conductive film according to a second embodiment of the present invention.

Figure 1A:
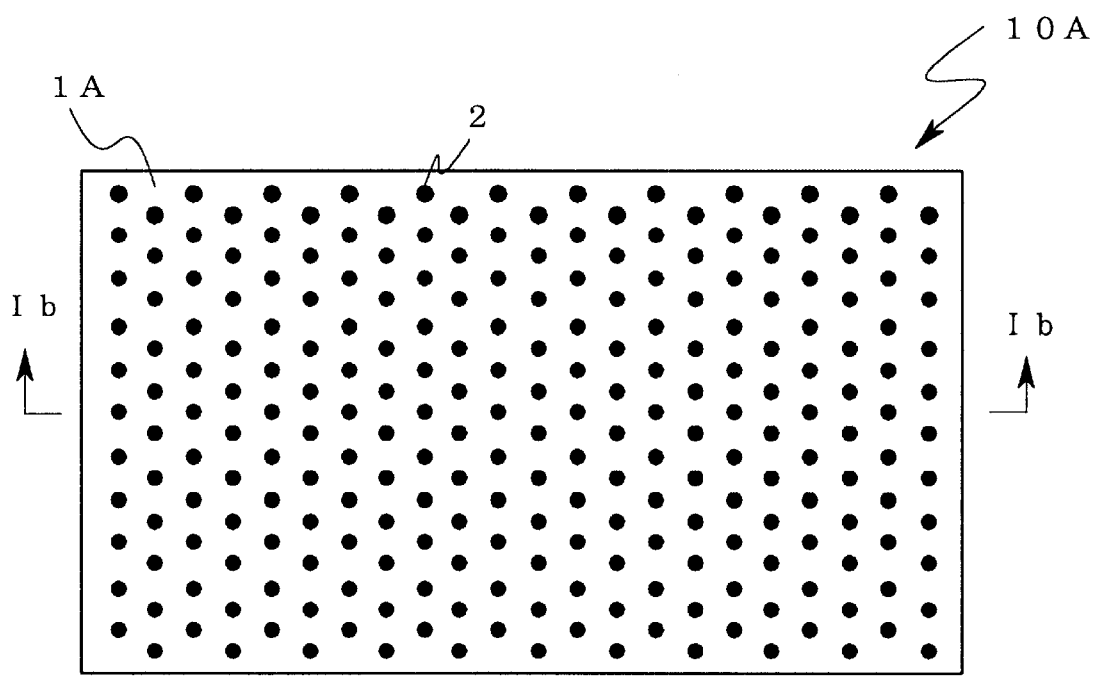
FIG. 1(a) is a plan view.

In the FIG. 1A is a film substrate, 1a is the top face of the film substrate, 1b is the back face of the film substrate, 2 is a conductive path, 2a and 2b are the ends of the conductive path, and 10A is an anisotropic conductive film.

DETAILED DESCRIPTION OF THE INVENTION

The present invention is hereinafter described in more detail.

Figure 1B:
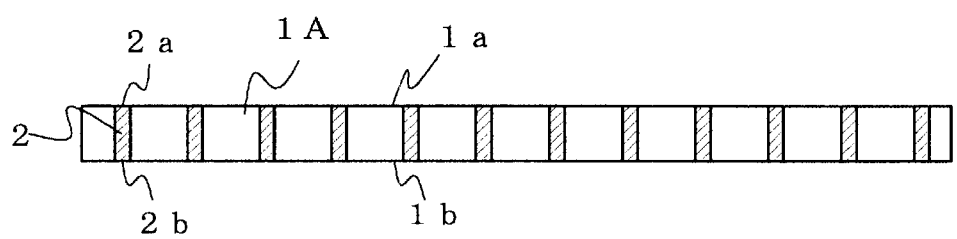
FIG. 1(b) is a cross-sectional view along the line Ib—Ib in FIG. 1(a).

FIG. 1 shows an example of the anisotropic conductive film of the first embodiment of the present invention, i.e., an anisotropic conductive film useful as a mounting connector. FIG. 1(a) is a plan view, and FIG. 1(b) is a cross-sectional view along the line Ib—Ib in FIG. 1(a). The anisotropic conductive film of the first embodiment of the present invention, as represented by this anisotropic conductive film 10A, has a plurality of conductive paths 2 insulated from each other in a film substrate 1A comprising an insulating resin and penetrating the film substrate 1A in the direction of the thickness of the film substrate, both ends 2a and 2b of each conductive path 2 being exposed to the top and back faces 1a and 1b, respectively, of the film substrate 1A, wherein the film substrate 1A is mainly composed of a polycarbodiimide copolymer has a structure represented by formula (I) below (hereinafter also referred to as polycarbodiimide copolymer of formula (I)).

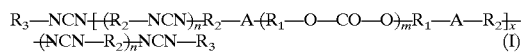

wherein m represents an integer from 2 to 50; n represents an integer from 1 to 30; x represents an integer from 1 to 10; A represents a urethane bond; $R_1$ represents an alkylene group; $R_2$ represents an aromatic diisocyanate residue; and $R_3$ represents an aromatic monoisocyanate residue.

The polycarbodiimide copolymer of formula (I) is prepared by introducing a polyalkylene carbonate unit into the principal chain of a polycarbodiimide resin synthesized from an aromatic diisocyanate.

With respect to formula (I), the alkylene group for $R_1$ in the polyalkylene carbonate unit preferably has 2 to 12 carbon atoms and may be linear or branched. of such alkylene groups, an ethylene group, a tetramethylene group, a hexamethylene group, and a dodecamethylene group are preferred, with greater preference given to a hexamethylene group.

The aromatic diisocyanate residue for $R_2$ is a residue resulting from the elimination of the two isocyanates from an aromatic diisocyanate, and is exemplified by 4,4'- diphenylmethane diisocyanate, 4,4'-diphenyl ether diisocyanate, p-phenylene diisocyanate, m-phenylene diisocyanate, o-tolidine diisocyanate, naphthylene diisocyanate, 2,4-tolylene diisocyanate, and 2,6-tolylene diisocyanate; these residues may be used singly or in combination of two or more kinds. Of these residues, 2,4-tolylene diisocyanate and/or 2,6-tolylene diisocyanate is preferred.

The aromatic monoisocyanate residue for $R_3$ in the formula is a residue resulting from the elimination of the isocyanate from an aromatic monoisocyanate, and is exemplified by phenyl isocyanate, tosyl isocyanate, dimethylphenyl isocyanate, chlorophenyl isocyanate, p-isopropylphenyl isocyanate, diisopropylphenyl isocyanate, naphthyl isocyanate, and benzyl isocyanate; these residues may be used singly or in combination of two or more kinds. Of these residues, p-isopropylphenyl isocyanate is particularly preferred. Because the aromatic monoisocyanate is located at an end of the repeat structure of the copolymer of formula (I), it serves as a controller of the molecular weight of the copolymer.

When the repeat number n of the carbodiimide unit is greater than 30, gelation will occur during polymerization of the copolymer, which in turn hampers the obtainment of the desired product as a solid. In other words, as described below, the copolymerization reaction for said polycarbodiimide copolymer is normally carried out in a solvent, which solvent is volatilized (evaporated) from the solution after the reaction, and the copolymer is collected as a film; this operation becomes impossible. When the degree of polymerization m of the polyalkylene carbonate is greater than 50, the polymer solubility in the solvent will decrease, so that the copolymerization reaction becomes difficult due to poor workability. When the repeat number x, which indicates the amount of polyalkylene carbonate introduced, is greater than 10, the molecular weight of the copolymer will become so great that the copolymer gels during the polymerization reaction, thus posing the same problem as described above.

As described above, when a conventional anisotropic conductive film employing a polycarbodiimide resin for the film substrate 1A is used as a mounting connector, connection targets (electronic component and circuit board) cannot be connected satisfactorily (joined firmly to provide electrical continuity) unless the anisotropic conductive film is heated to a temperature of 250° C. or higher for thermal compression bonding. On the other hand, when the anisotropic conductive film of the first embodiment of the present invention is used, the film substrate 1A softens or melts sufficiently upon heating at a low temperature of about 150 to 200° C. so that a good connection can be achieved between said film and the subjects of connection. In addition, because the film substrate 1A possesses favorably low water absorption derived from the polycarbodiimide resin, the finished product obtained by mounting (e.g., a semiconductor device wherein a semiconductor element is mounted on a circuit board) will be highly reliable in terms of moisture resistance.

The polycarbodiimide copolymer of formula (I) can, for example, be produced by reacting a polyalkylene carbonate diol and an aromatic diisocyanate in an excess of an aromatic diisocyanate (i.e., carrying out a urethanization reaction of a hydroxyl group and an isocyanate), subsequently adding a monoisocyanate to bind to an end of the repeat structure, and carbodiimidizing the aromatic diisocyanate component in the reaction system using a carbodiimidization catalyst.

The reaction described above is normally carried out in an appropriate solvent. Useful solvents include alicyclic hydrocarbon solvents such as cyclohexane; aromatic hydrocarbon solvents such as benzene, toluene, ethylbenzene, xylene, and cumene; alicyclic ethers such as tetrahydrofuran and dioxane; and ketone solvents such as acetone, methyl ethyl ketone, methyl isobutyl ketone, and cyclohexanone. These solvents may be used singly or in combination of two or more kinds.

The reaction of a polyalkylene carbonate diol and an aromatic diisocyanate is normally carried out in the presence of about 2 to 50 mol of the aromatic diisocyanate per mol of the polyalkylene carbonate diol at a temperature of about 0 to 150° C. for about 10 minutes to 3 hours.

Although various carbodiimidization catalysts can be used, preference is given to, for example, 1-phenyl-2-phosphorene-1-oxide, 3-methyl-1-phenyl-2-phosphorene-1-oxide, 1-phenyl-2-phosphorene-1-sulfide, 1-ethyl-3-methyl-2-phosphorene-1-oxide, 3-methyl-1-phenyl-1-phospha-3-cyclopenten-1-oxide, 2,5-dihydro-3-methyl-1-phenylphosphor-1-oxide, corresponding isomers, 3-phosphorene, etc. In addition, the amount of catalyst used for this purpose is preferably about 0.01 to 5% by weight relative to the entire amount of the isocyanate component. The carbodiimidization reaction is preferably carried out at a temperature of about 40 to 150° C. for about 10 minutes to 5 hours.

The polycarbodiimide copolymer of formula (I) preferably has a number-average molecular weight of 1000 to 10000, more preferably 2000 to 8000. This number-average molecular weight is determined by GPC under the operating conditions: instrument: HLC8120 (TOSOH CORPORATION), column: $GMH_{HR-H}$+$GMH_{HR-H}$+$G_{2000}H_{HR}$ (all produced by TOSOH CORPORATION, the three units connected in a series), developing solvent: tetrahydrofuran, and expressed on a polystyrene basis.

In addition, the glass transition temperature of the polycarbodiimide copolymer of formula (I) is preferably 50 to 150° C. This glass transition temperature is determined by TMA (thermomechanical analysis) in the tensile mode. This determination was conducted at a heating rate of 5° C./minute under a tensile load of 1 g. The point of inflexion on the TMA curve thus obtained was taken as the glass transition temperature.

The phrase "wherein the film substrate 1A is mainly composed of the polycarbodiimide copolymer of formula (I)" as used with regard to the anisotropic conductive film of the first embodiment of the present invention means that the polycarbodiimide copolymer of formula (I) may alone constitute the film substrate 1A, or the polycarbodiimide copolymer of formula (I) in combination with a different insulating resin formulated as necessary may constitute the film substrate 1A.

While the anisotropic conductive film of this embodiment preferably comprises the film substrate 1A consisting of the polycarbodiimide copolymer of formula (I) alone, a different insulating resin may be contained in a ratio of 15% by weight or lower relative to the entire amount of the film substrate 1A. Such different insulating resin may be an insulating resin that has been traditionally used as a film substrate material in the art, and is exemplified by polyimide resin, polyetherimide resin, polyamide resin, phenoxy resin, polycarbodiimide resin, fluorine resin, polyester resin, polyurethane resin, polyamidoimide resin, and epoxy resin. These resins may be used singly or in combination of two or more kinds.

The anisotropic conductive film of this embodiment is especially useful as a mounting connector. In view of this purpose of use, the thickness of the film substrate 1A is preferably about 10 to 200 μm, more preferably about 20 to 100 μm.

The conductive path 2 may be made of various metals. Copper, gold, aluminum, nickel, etc. are preferable, with greater preference given to copper and gold from the viewpoint of conductivity. Of the various metal lead wires, those produced to permit electricity conduction, e.g., the copper lead wire specified in JIS C 3103, are more preferable, and can provide the conductive path best in terms of electrical characteristics, mechanical characteristics, and production cost.

The cross-sectional shape (shape of a cross-section parallel to the plane extension direction of the film substrate 1A), size, and pitch (arrangement interval) of the conductive path 2 are set forth as appropriate according to the conditions (terminal shape, pitch, etc.) of the terminal-formed face of the subjects of connection (electronic component, circuit board). Normally, the cross-sectional shape of the conductive path 2 is preferably circular or regularly polygonal. In addition, the size is preferably about 5 to 100 μm in cross-sectional diameter for a conductive path with a circular cross-section, and is suitably of a cross-sectional area corresponding to the area of a circle of the aforementioned diameter for a conductive path with a regularly polygonal cross-section. Generally, the pitch (arrangement interval) of the conductive path is preferably 25 to 100 μm, more preferably 40 to 80 μm, in the distance between the center lines of conductive paths.

Both ends (end faces) 2a and 2b of the conductive path 2, which are exposed to the top and back faces of the film substrate 1A, may be present on the same planes as the faces of the film substrate 1A, may be concave from the faces of the film substrate 1A, and may be convex from the faces of the film substrate 1A, and these conditions may be present concurrently. In addition, other embodiments may be combined variously, including an embodiment wherein one end (end face) of the conductive path is convex from one face (either one of the top and back faces) of the film substrate 1A, whereas one end of the conductive path is concave from the other face (either one of the top and back faces) of the film substrate 1A. The mode of concave and convex of the ends of the conductive path 2 may be selected according to the shapes etc. of the terminals (electronic component electrode, circuit board wiring pattern) of the subjects of connection.

When one end of the conductive path 2 is convexed from one face of the film substrate 1A, it is preferable from the viewpoint of connection reliability that the convex be about 0.5 to 30 μm, more preferably about 1 to 15 μm. When one end of the conductive path 2 is concaved from one face of the film substrate 1A, it is preferable that the concave be about 0.5 to 15 μm, more preferably about 1 to 10 μm.

The surfaces of the ends of the conductive path 2 may be further coated with a highly conductive metal material or a material with excellent corrosion resistance, such as gold or nickel. In addition, materials for the conductive path 2, especially the material for coating the ends of the electronic component may be selected as preferable according to the material of the surface of the electronic component electrode. There may be mentioned, for example, a combination of aluminum (electronic component electrode) and gold (conductive path 2) and a combination of a barrier metal (electronic component electrode) and solder (conductive path 2). A barrier metal refers to a metal used to configure a layer for preventing the diffusion reaction between the Al used as a wiring material in the electronic component and an external metal. Examples of barrier metals include simple substances, alloys, etc. of Cr, Au, Ni, etc.

The arrangement pattern of conductive paths 2 (arrangement pattern of conductive paths 2 in FIG. 1(a)) may be, but is not limited to, the pattern having a highest density as shown in FIG. 1, as well as a square matrix pattern and other randomly compact patterns.

The production method for said anisotropic conductive film of the first embodiment is preferably exemplified by, but is not limited to, two methods (A) and (B) below.

(A) Production method for anisotropic conductive film described in International Patent Publication WO98/07216 This method is a production method comprising the steps of:

1) winding an insulated lead wire with a coating layer comprising an insulating resin formed on the surface of a metal lead wire of a desired thickness in a roll around a core member to yield a wound coil;
2) heating and/or pressurizing said wound coil to yield a wound coil block wherein the coating layers of adjacent insulated lead wires are unified by melt bonding and/or compression bonding; and
3) slicing said wound coil block to a desired film thickness along a plane forming an angle with each insulated lead wire.

In this production method, by selectively using an insulated lead wire wherein a coating layer is formed with the polycarbodiimide copolymer of formula (I), the anisotropic conductive film of the present invention, wherein the film substrate 1A is formed with the polycarbodiimide copolymer of formula (I), is obtained.

To make the film substrate 1A to comprise both the polycarbodiimide copolymer of formula (I) and a different insulating resin, an insulated lead wire is used wherein a coating layer containing both the polycarbodiimide copolymer of formula (I) and the different insulating resin is formed. Such an insulated lead wire may be one wherein a coating layer is formed with a mixture of the polycarbodiimide copolymer of formula (I) and the different insulating resin, or one wherein a coating layer is formed with a laminate of a layer of the polycarbodiimide copolymer of formula (I) and a layer of the different insulating resin. In addition, by allowing the presence of both an insulated lead wire wherein a coating layer of the polycarbodiimide copolymer of formula (I) is formed, and an insulated lead wire wherein a coating layer of the different insulating resin is formed, in the wound coil block, the different insulating resin may be incorporated in the film substrate 1A.

(B) Production method proposed by the present applicant in Japanese Patent Application No. 2000-117039 and U.S. Pat. No. 6,566,608

Figure 2A:
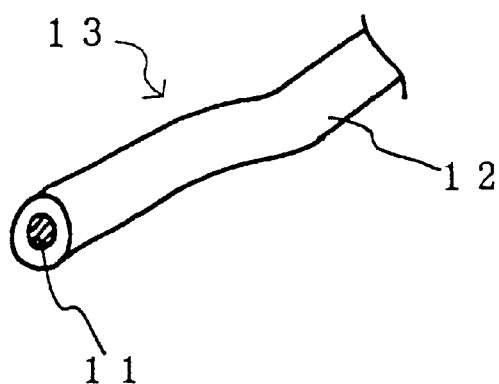
FIGS. 2(a) through 2(c) show the steps of alternately winding a winding layer comprising an insulated lead wire and an insulating resin film around a core member (lamination work) in the production of the anisotropic conductive film of the present invention.
Figure 2B:
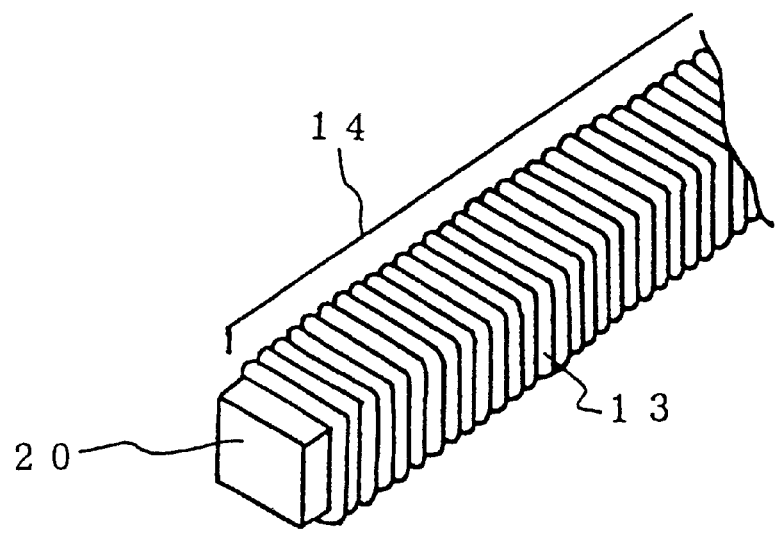
Figure 2C:
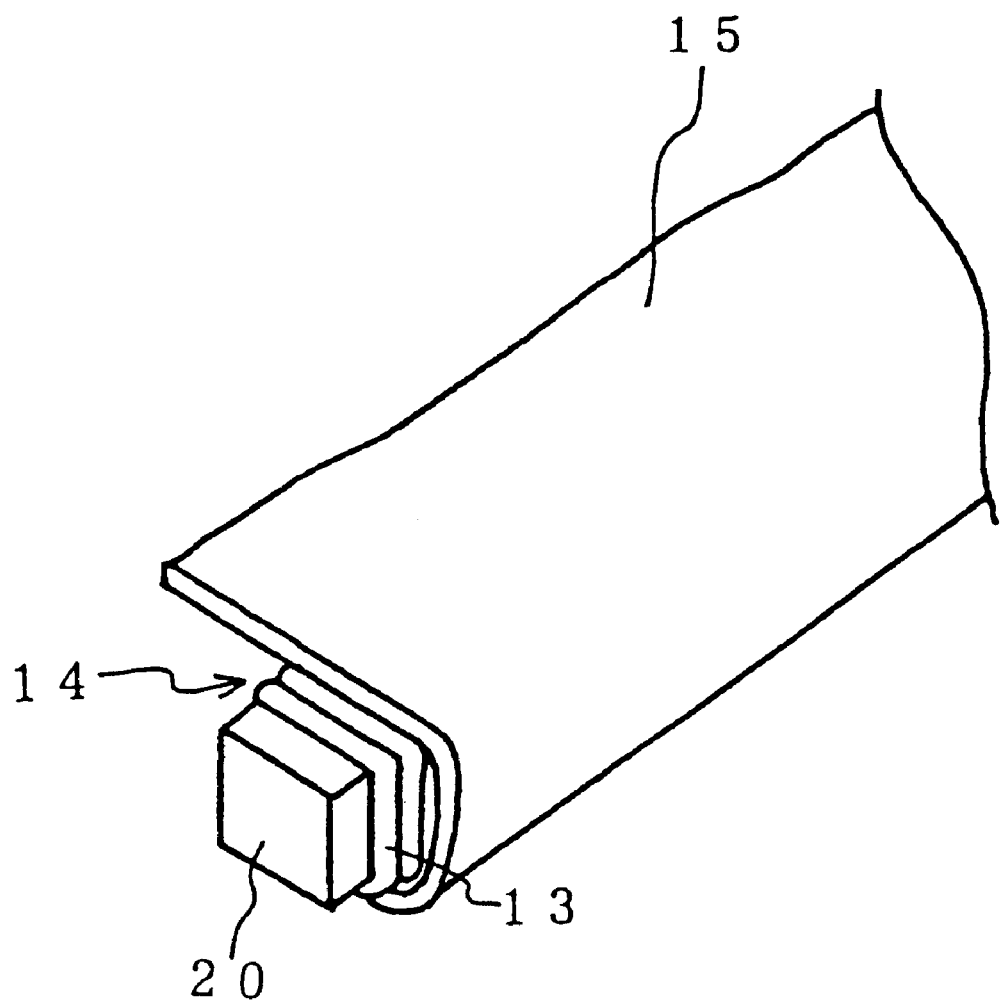
Figure 3A:
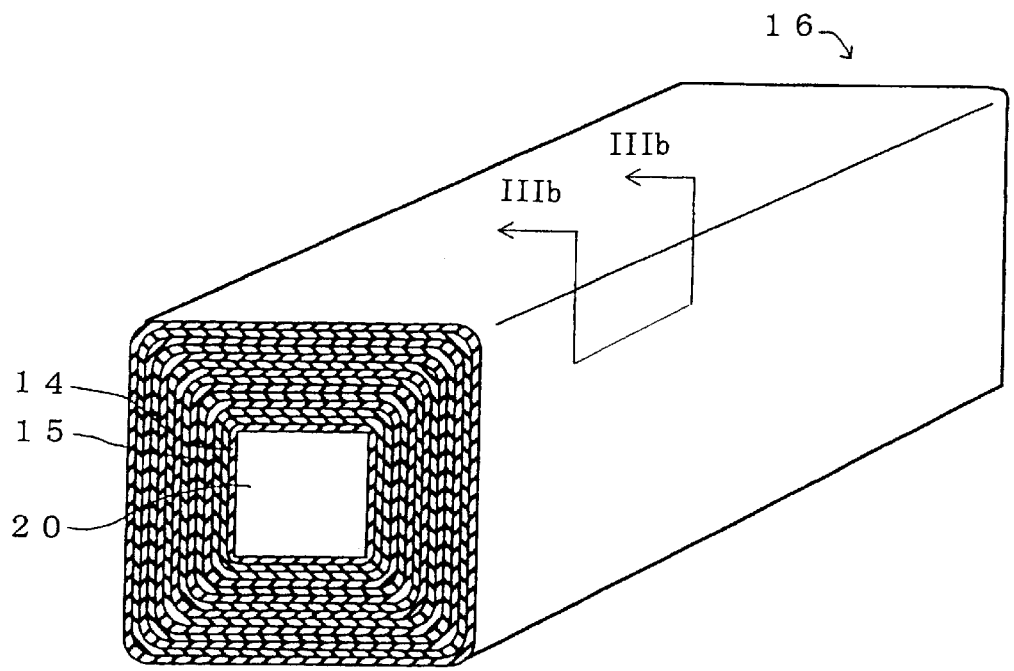
FIG. 3(a) is an oblique view.
Figure 3B:
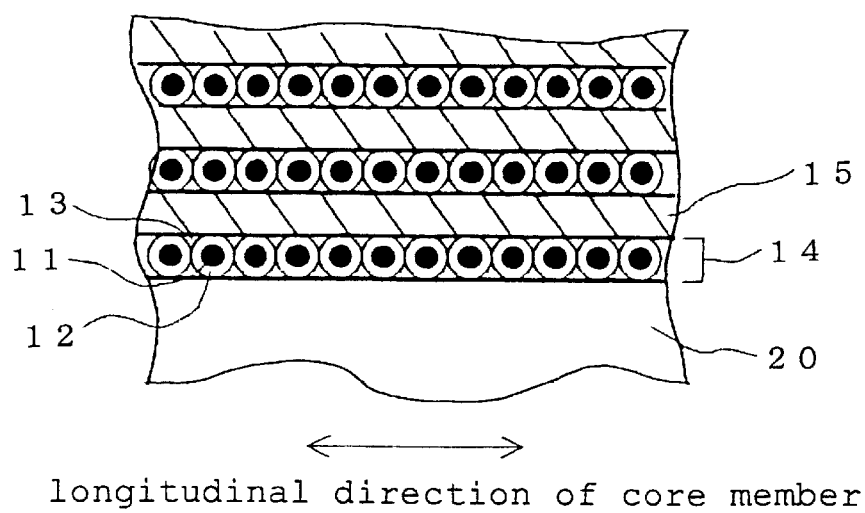
FIG. 3(b) is a cross-sectional view along the line IIIb—IIIb in FIG. 3(a).

This method is a production method comprising the steps of:

1) winding the insulated lead wire 13 shown in FIG. 2(a), wherein a coating layer 12 comprising an insulating resin is formed on the surface of a metal lead wire 11, in a roll around a core member 20 to yield a single winding layer 14 comprising the insulated lead wire 13 as shown in FIG. 2(b);
2) repeating the winding of an insulating resin film 15 around this winding layer 14 as shown in FIG. 2(c), to yield a laminate 16 wherein the single winding layer 14, which comprises the insulated lead wire, and the insulating resin film 15, shown in FIGS. 3(a) and (b), are alternately superposed;
3) melting at least one of the coating layer 12 of the insulated lead wire 13, and the insulating resin film 15 in this laminate 16 to yield a block of the laminate 16; and 4) slicing said block of the laminate 16 to a desired film thickness along a plane forming an angle with the insulated lead wire 13 (metal lead wire 11).

In this method, by using the insulated lead wire 13 having a coating layer formed with the polycarbodiimide copolymer of formula (I), and using the insulating resin film 15 comprising the polycarbodiimide copolymer of formula (I), the anisotropic conductive film of the present invention, wherein the film substrate 1A is formed with the polycarbodiimide copolymer of formula (I) alone, is obtained.

To make the film substrate 1A comprising both the polycarbodiimide copolymer of formula (I) and a different insulating resin, at least one of the insulated lead wire 13 and the insulating resin film 15 should contain the different insulating resin. For example, when every insulated lead wire 13 is formed using the coating layer 12 of the polycarbodiimide copolymer of formula (I), every insulating resin film 15 or some of the insulating resin films 15 should have a film made from the different insulating resin or a film made from both the polycarbodiimide copolymer of formula (I) and said different insulating resin. When every insulating resin film 15 is a film made from the polycarbodiimide copolymer of formula (I), every insulated lead wire 13 or some of the insulated lead wires 13 should have a coating layer 12 made from the different insulating resin or a coating layer 12 made from both the polycarbodiimide copolymer of formula (I) and the different insulating resin. Here, the film containing both the polycarbodiimide copolymer of formula (I) and the different insulating resin may be a film made from a mixture of the polycarbodiimide copolymer of formula (I) and the different insulating resin, or a film having a laminate structure consisting of a layer of the polycarbodiimide copolymer of formula (I) and a layer of the different insulating resin. The insulated lead wire 13 having the coating layer 12 containing both the polycarbodiimide copolymer of formula (I) and the different insulating resin, as in the method (A) above, may have a coating layer 12 made from a mixture of the polycarbodiimide copolymer of formula (I) and the different insulating resin, or a coating layer 12 having a laminate structure consisting of a layer of the polycarbodiimide copolymer of formula (I) and a layer of the different insulating resin.

In the production method (B) above for an anisotropic conductive film, the conductive path arrangement interval (pitch) in the film can be adjusted by the thickness of the coating layer 12 of the insulated lead wire 13 and the thickness of the insulating resin film 15, because a block is obtained from the laminate 16 (multiple-layer structure) wherein the winding layer 14 of the insulated lead wire 13 and the insulating resin film 15 are alternately and repeatedly superposed on the core member 20 block, and the film is cut out from said block. Method (B) is therefore advantageous over method (A) above, wherein the film is cut out from the block of the wound coil of the insulated lead wire (in this method, arrangement interval of the conductive paths (pitch) in the film depends solely on the thickness of the coating layer of the insulated lead wire), because the arrangement interval (pitch) of the conductive paths in the film can be expanded easily.

To obtain an anisotropic conductive film having a structure wherein one end of the conductive path is convex from one face of the film substrate, an anisotropic conductive film produced by method (A) or (B) above may be treated to etch the film substrate (insulating resin portion), or to metal-deposit one end face of the metal lead wire by plating or the like.

The anisotropic conductive film of the second embodiment of the present invention is hereinafter described.

Figure 4A:
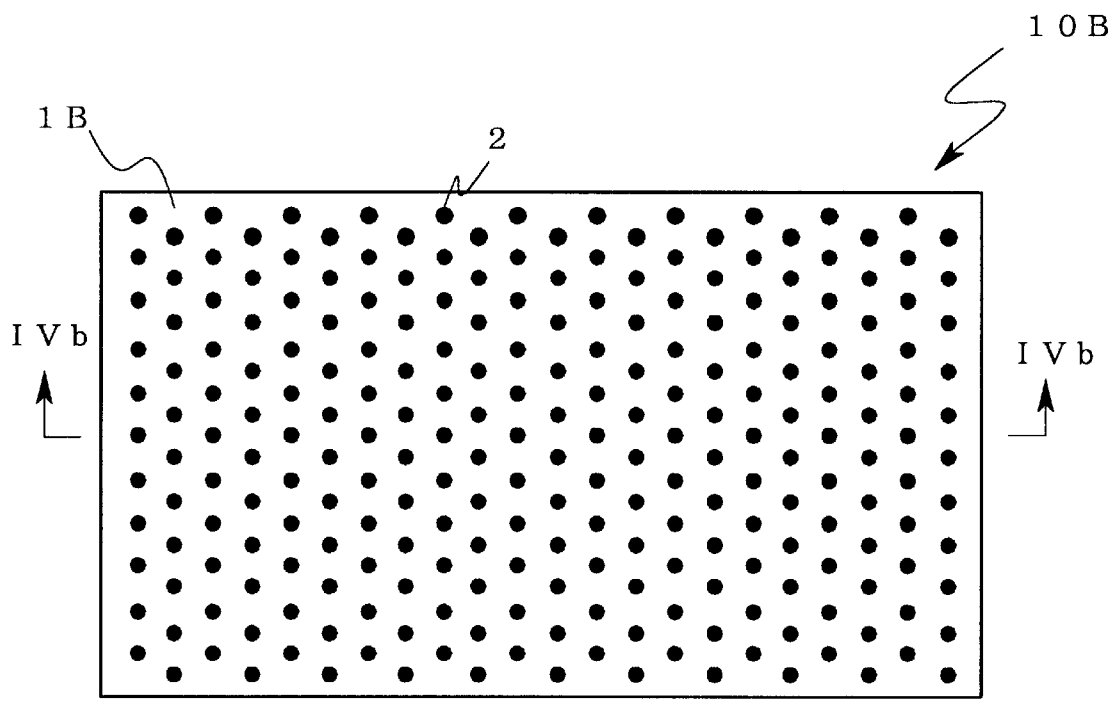
FIG. 4(a) is a plan view.
Figure 4B:
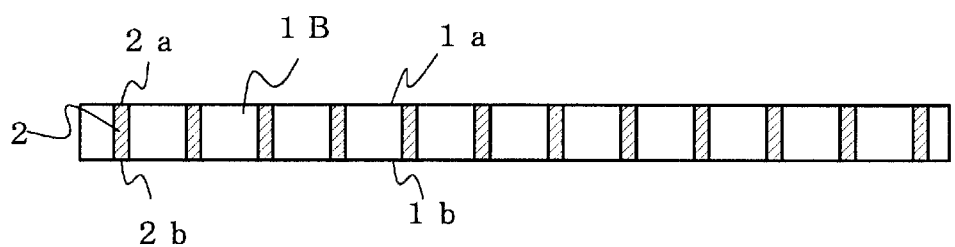
FIG. 4(b) is a cross-sectional view along the line IVb—IVb in FIG. 4(a).

FIG. 4 shows an example of the anisotropic conductive film of the second embodiment of the present invention, i.e., an anisotropic conductive film especially useful as a testing connector. FIG. 4(*a*) is a plan view, and FIG. 4(*b*) is a cross-sectional view along the line IVb—IVb in FIG. 4(*a*). The anisotropic conductive film of the second embodiment of the present invention, as represented by this anisotropic conductive film 10B in FIG. 4, has a plurality of conductive paths 2 insulated from each other in the film substrate 1B comprising an insulating resin and penetrating the film substrate 1B in the direction of the thickness of the film substrate 1B, both ends 2a and 2b of each conductive path 2 being exposed to the top and back faces 1a and 1b, respectively, of the film substrate 1B, wherein the film substrate 1B is mainly composed of a setting product of the polycarbodiimide copolymer of formula (I) above. The phrase "mainly composed of a setting product of the polycarbodiimide copolymer of formula (I)" as used herein means that the setting product of the polycarbodiimide copolymer of formula (I) may alone constitute the film substrate, or the setting product of the polycarbodiimide copolymer of formula (I) in combination with a different insulating resin formulated as necessary may constitute the film substrate.

The anisotropic conductive film of this embodiment has its film substrate 1B consisting essentially of a setting product of the polycarbodiimide copolymer of formula (I), the other members being basically the same as the anisotropic conductive film of the first embodiment.

Regarding the anisotropic conductive film of this embodiment, the film substrate 1B is highly resistant to heat and relatively easily deformed because it is mainly composed of a setting product of the polycarbodiimide copolymer of formula (I). For this reason, when the anisotropic conductive film is placed between an electronic component and a circuit board and pressure adhered to both of the electronic component and the circuit board, a warp and/or waviness, if present therein, can be absorbed by a deformation of the film substrate 1B. Therefore, when a functional test of an electronic component such as a semiconductor element is conducted at a temperature of 150° C. or higher (generally 150 to 200° C.), the film substrate 1B does not soften or melt and, in addition, both ends of the conductive path in the film substrate 1B can surely be brought into contact with the electronic component electrode and circuit board circuit (wiring) pattern with pressurization under a relatively low pressure (load).

In a functional test of an electronic component such as a semiconductor element, a circuit board as a product for actually mounting an electronic component may be used; in many cases, however, a circuit board as a testing tool modeled on such a circuit board product is used. The same applies when a functional test of an electronic component is conducted using the anisotropic conductive film of the present invention as a testing connector.

It is known that a setting product of high hardness is obtained when a polycarbodiimide resin is kept at a high temperature. The polycarbodiimide copolymer of formula (I) undergoes thermal setting when kept at a high temperature of 150 to 200° C. for about 0.5 to 5 hours.

In the anisotropic conductive film of this embodiment, the setting product of the polycarbodiimide copolymer of formula (I) that constitutes the film substrate 1B refers to a setting product obtained by keeping the polycarbodiimide copolymer of formula (I) at a high temperature of 150 to 200° C. Extent of setting is preferably such that the durometer hardness determined by the method described in JIS K 7215 is about 75 to 90, more preferably about 80 to 90. In addition, the glass transition temperature after setting is preferably 150 to 250° C.

When the durometer hardness of the setting product of the polycarbodiimide copolymer of formula (I) is smaller than 75, the film substrate 1B will be insufficiently resistant to heat. When the durometer hardness exceeds 90, the film substrate 1B will become unlikely to deform, and the elastic modulus of the anisotropic conductive film will be so great that it is difficult to pressure adhere the anisotropic conductive film to both the electronic component and the circuit board to achieve appropriate electrical continuity under a low pressure (load).

While the anisotropic conductive film of this embodiment preferably comprises a film substrate 1B consisting exclusively of a setting product of the polycarbodiimide copolymer of formula (I), a different insulating resin may be incorporated to confer flexibility and for other purposes, as long as its content ratio is not more than 15% by weight relative to the total amount of the film substrate 1B. Examples of the different insulating resin are the same as those of the different insulating resin that may be incorporated in the film substrate 1B of the anisotropic conductive film of the first embodiment described above.

Said anisotropic conductive film of the second embodiment is particularly useful as a testing connector. From this viewpoint, it is preferable that the thickness of the film substrate 1B be about 50 to 600 μm, more preferably about 60 to 500 μm.

The materials, cross-sectional shape, size, etc. of the conductive path 2 are basically the same as those of the conductive path 2 of the anisotropic conductive film of the first embodiment described above. The cross-sectional shape is preferably circular or regularly polygonal, and the size is preferably about 5 to 30 μm in cross-sectional diameter when the conductive path 2 has a circular cross-section, and is suitably of a cross-sectional area corresponding to the area of a circle of the aforementioned diameter when the conductive path 2 has a regularly polygonal cross-section. The pitch of conductive path 2 (arrangement interval) is preferably about 5 to 250 μm, more preferably about 100 to 200 μm, in the distance between the center lines of conductive paths 2.

Both ends (end faces) of the conductive path 2, which are exposed to the top and back faces of the film substrate 1B, may be present on the same plane as the faces of the film substrate 1B, may be concave from the faces of the film substrate 1B, and may be convex from the faces of the film substrate 1B, and these conditions may be present concurrently. In addition, other embodiments may be combined variously, including an embodiment wherein one end (end face) of the conductive path 2 is convex from one face (either one of the top and back faces) of the film substrate 1B, whereas one end of the conductive path 2 is concave from the other face (either one of the top and back faces) of the film substrate 1B. The mode of concave and convex of the ends of the conductive path 2 may be selected according to the conditions of the terminal-formed faces of the electronic component and the circuit board.

When an end of the conductive path 2 is convexed from a face of the film substrate 1B, it is preferable from the viewpoint of good electrical continuity that the convex be about 2 to 100 μm, more preferably about 10 to 60 μm. When an end of the conductive path 2 is concaved from a face of the film substrate 1B, it is preferable that the concave be about 0.5 to 15 μm, more preferably about 1 to 10 μm.

In addition, the anisotropic conductive film of the second embodiment described above preferably has an elastic modulus of 1 to 1000 MPa, more preferably 5 to 900 MPa for the entire anisotropic conductive film at 150° C. to 250° C. When the elastic modulus is lower than 1 MPa, the anisotropic conductive film will adhere to the electronic component and/or the circuit board and be difficult to remove from these members after completion of the test. When the elastic modulus exceeds 1000 MPa, the anisotropic conductive film will be incapable of sufficiently absorbing the warp and waviness of the electronic component and/or the circuit board.

The elastic modulus of the entire anisotropic conductive film is influenced not only by the structural material and thickness of the film substrate 1B but also by the materials of the conductive path 2, density and arrangement pattern of the conductive path 2 in the film substrate, convex height of the conductive path 2 from the film substrate face 1B, etc. It is preferable, therefore, that these parameters be set forth so that the elastic modulus of the entire anisotropic conductive film falls within the respective preferable ranges described above.

The elastic modulus of the entire anisotropic conductive film can be determined using, for example, a dynamic viscoelasticity analyzer (DMS210, produced by Seiko Instruments Inc.). This determination is conducted at both 150° C. and 250° C. at a constant frequency (10 Hz) with heating at a rate of 5° C./minute in the tensile mode along one of the directions of the film face extension of said anisotropic conductive film. The sample thickness input at the time of determination should be the same as the length of the conductive path 2 (=thickness of the entire anisotropic conductive film).

The production method for the anisotropic conductive film of the second embodiment is not subject to limitation. For example, in method (A) above, mentioned as an example production method for the anisotropic conductive film of the first embodiment described above, the heating to melt and solidify the coating layer of the insulated lead wire for obtaining a block of a wound coil comprising an insulated lead wire is conducted at a temperature of 150 to 200° C. Alternatively, the anisotropic conductive film of the second embodiment can be produced by conducting the heating to melt and solidify the coating layer of the insulated lead wire and the insulating resin film for obtaining a block of a laminate wherein winding layer of the insulated lead wire and the insulating resin film are alternately and repeatedly superposed at a temperature of 150 to 200° C. in method (B).

Using the anisotropic conductive film of the second embodiment, a functional test of an electronic component can be conducted with the anisotropic conductive film being pressure adhered to the electronic component and a circuit board under a low pressure (low load) such that the contact load per electrode in the electronic component is about 9.8 to 294 mN at a temperature of 150° C. or higher. The contact load per electrode of the electronic component is a value obtained by dividing the pressure (load) applied to achieve electrical continuity for all the electrodes of the electronic component by the number of electrodes of the electronic component.

EXAMPLES

The present invention is hereinafter described in more detail by means of, but is not limited to, the following working examples and comparative examples.

Example 1

A mixture (100 g) of tolylene diisocyanate (2,4-tolylene diisocyanate (2,4-TDI) and 2,6-tolylene diisocyanate (2,6-

TDI) (2,4-TDI:2,6-TDI=2:8 (molar ratio)) and polyhexamethylene carbonate diol (100 g) were urethanized by a reaction in a mixed solvent (100 g) of xylene and cyclohexane at 100° C. for 3 hours. Subsequently, 3-methyl-1-phenyl-2-phosphorene-1-oxide (0.883 g) and p-isopropylphenyl isocyanate (6.47993 g) were added, and this was followed by polymerization at 100° C. for 1 hour to yield a solution of a polycarbodiimide copolymer resulting from copolymerization of polyhexamethylene carbonate. This solution was dried at 90° C. for 30 minutes and at 200° C. for 30 minutes to yield a film, and the polycarbodiimide copolymer was collected as a solid. The glass transition temperature of this solid was determined to be 130° C. The number-average molecular weight of this solid was determined to be 6300.

An insulated lead wire was prepared by coating a copper wire 18 $\mu$m in diameter with a coating layer of the polycarbodiimide copolymer synthesized above. Using this insulated lead wire, an anisotropic conductive film (film thickness: 70 $\mu$m, the distance between the center lines of conductive paths (pitch): 50 $\mu$m on average) was prepared by method (A) above, wherein conductive paths are arranged at the highest density with both ends (end faces) of each conductive path being present on the same planes as the top and back faces of the film substrate, as illustrated in FIG. 1. The heating to melt the insulated lead wire coating layer for obtaining a block of the wound coil in the manufacturing stage was conducted at 140° C. for 1 hour.

As a semiconductor element, an integrated circuit chip with a chip size of 8 mm×8 mm in outer dimensions and 300 $\mu$m in thickness, a pad size of 100 $\mu$m×100 $\mu$m in outer dimensions and 1 $\mu$m in thickness, a pad pitch of 200 $\mu$m, and a pad number of 219 was provided. The pad used was an Al pad.

On the circuit pattern-formed face of a circuit board wherein a circuit pattern of Cu/Ni/Au (circuit width 100 $\mu$m, space between adjacent circuits 100 $\mu$m) is formed on an FR-4 substrate (glass-epoxy substrate) 1 mm in thickness, the anisotropic conductive film prepared above was mounted. On this anisotropic conductive film, the semiconductor element described above was mounted, and bonding was conducted using a flip chip bonder at a temperature of 150° C. under a load (pressure) of 1.96 MPa for a pressurization time of 40 seconds, and the semiconductor element was mounted on the circuit board. As a result, electrical continuity was achieved for all the electrodes (pads) of the semiconductor element. In addition, regarding the finished product after mounting, no discoloration was observed in the base substrate of circuit board, i.e., the FR-4 substrate (glass-epoxy substrate); a highly reliable semiconductor device was thus obtained.

Comparative Example 1

2,4'-Tolylene diisocyanate (100 g), 3-methyl-1-phenyl-2-phosphorene-1-oxide (0.883 g) and p-isopropylphenyl isocyanate (6.47993 g) were polymerized in a mixed solvent (100 g) of xylene and cyclohexane at 100° C. for 1 hour to yield a polycarbodiimide solution. This solution was dried at 90° C. for 30 minutes and at 200° C. for 30 minutes, and a polycarbodiimide resin was collected as a solid. The glass transition temperature of this solid was determined to be 230° C. The number-average molecular weight was determined to be 4800.

An insulated lead wire was prepared by coating a copper wire 18 $\mu$m in diameter with a coating layer of the polycarbodiimide copolymer synthesized above. Using this insulated lead wire, an anisotropic conductive film (film thickness: 70 $\mu$m, the distance between the center lines of conductive paths (pitch): 50 $\mu$m on average) was prepared by method (A) above, wherein conductive paths are arranged at the highest density with both ends (end faces) of each conductive path being present on the same planes as the top and back faces of the film substrate, as illustrated in FIG. 1. The heating to melt the coating layer of the insulated lead wire for obtaining a block of the wound coil in the manufacturing stage was conducted at 175° C. for 1 hour.

On the circuit pattern-formed face of the same circuit board as that used in Example 1, the anisotropic conductive film produced in Comparative Example 1 was mounted. On this anisotropic conductive film, the same semiconductor element as that used in Example 1 was mounted, bonding was conducted under the same conditions as Example 1 (temperature 150° C., load (pressure) 1.96 MPa, pressurization time 40 seconds) using a flip chip bonder, and the semiconductor element was mounted on the circuit board. As a result, the electrical continuity rate of the semiconductor element electrodes (pads) was 20%. Bonding was conducted at a bonding temperature of 300° C. wherein load and pressurization time were the same as those shown above. As a result, electrical continuity was achieved in every electrode, but the circuit board base substrate, i.e., the FR-4 substrate (glass-epoxy substrate), discolored.

Example 2

An insulated lead wire was prepared by coating a copper wire (18 $\mu$m in diameter) having a coating layer of the polycarbodiimide copolymer synthesized above. Using this insulated lead wire, an anisotropic conductive film (film thickness: 70 $\mu$m, the distance between the center lines of conductive paths (pitch): 50 $\mu$m on average) was prepared by method (A) above, wherein conductive paths are arranged at the highest density with both ends (end faces) of each conductive path being present on the same planes as the top and back faces of the film substrate, as illustrated in FIG. 1. To melt the coating layer of the insulated lead wire for obtaining a block of the wound coil in the manufacturing stage, the temperature was raised at a rate of 10° C./minute and kept constant for 0.5 hour following the reach to 200° C., and then the coil was allowed to cool to room temperature. The elastic modulus at 150° C. of the anisotropic conductive film thus prepared was determined to be 200 MPa.

After a solid content sample of the polycarbodiimide copolymer synthesized in Example 1 was subjected to the same heat treatment as described above, its glass transition temperature was determined to be 170° C. Its durometer hardness was determined to be 85.

As a semiconductor element to be tested, an integrated circuit chip in a bear chip state with a chip size of 10 mm×10 mm in outer dimensions and 500 $\mu$m in thickness, a bump diameter of 70 $\mu$m, a bump height of 70 $\mu$m, a bump pitch of 200 $\mu$m, and a bump number of 156 was provided. The bump used was an Au stud bump.

On the circuit pattern-formed face of a circuit board wherein a circuit pattern of Cu/Ni/Au (circuit thickness: 18 $\mu$m, circuit width: 100 $\mu$m, space between adjacent circuits: 100 $\mu$m) is formed on an FR-4 substrate (glass-epoxy substrate) 1 mm in thickness, the anisotropic conductive film prepared above was mounted. On this anisotropic conductive film, the semiconductor element described above was mounted, and a load (pressure) of 9.8 N was applied from above. As a result, electrical continuity was achieved for all the bumps of the semiconductor element. A functional test (test time 24 hours) of the semiconductor element was conducted while maintaining this pressurization state at a temperature of 150° C. As a result, electrical continuity was maintained in all the bumps of the semiconductor element throughout the functional test, and the objective functional test was completed without any problem. After completion of the test, the semiconductor element, the anisotropic conductive film, and the circuit board were not in mutual adhesion and were readily separable from each other.

Comparative Example 2

An insulated lead wire was prepared by coating the copper wire used in Example 2 with silicone rubber. Using this insulated lead wire, an anisotropic conductive film (film thickness: 70 μm, the distance between the center lines of conductive paths (pitch): 50 μm on average) was prepared by method (A) above, wherein conductive paths are arranged at the highest density with both ends (end faces) of each conductive path being present on the same planes as the top and back faces of the film substrate.

On the circuit-formed face of the same circuit board as that used in Example 2, the anisotropic conductive film prepared above was mounted. On this anisotropic conductive film, the same semiconductor element as that used in Example 2 was mounted, and a load (pressure) of 9.8 N was applied from above. As a result, electrical continuity was achieved for all the bumps of the semiconductor element. Furthermore, the same functional test as in Example 2 was conducted on the semiconductor element, while maintaining this pressurization state at a temperature of 150° C. As a result, electrical continuity was achieved in all the bumps of the semiconductor element (100% electrical continuity) in the initial stage of the test, the Si component from the film substrate of the anisotropic conductive film adhered to the semiconductor element and the circuit board, causing an error.

As is evident from the above description, according to the anisotropic conductive film of the first embodiment of the present invention, fine electrical continuity can be achieved between an electronic component, such as a semiconductor element, and a circuit board by thermal compression bonding at a lower temperature (about 150 to 200° C.) as compared to a conventional anisotropic conductive film having a film substrate formed from a polycarbodiimide resin. As a result, an electronic component can be mounted on a circuit board without deterioration of the base substrate of the circuit board.

According to the anisotropic conductive film of the second embodiment, in a functional test of an electronic component at a temperature of 150° C. or higher, its film substrate does not adhere to the electronic component or a circuit board, the film does not generate an out-gas, and the film ensures electrical continuity between the electronic component and the circuit board with a relatively low pressure (low load), thereby enabling the testing.

This application is based on a patent application No. 2001-78456 filed in Japan, the contents of which are hereby incorporated by reference.

What is claimed is:

1. An anisotropic conductive film comprising a film substrate made of an insulating resin and a plurality of conductive paths insulated from each other and penetrating the film substrate in the direction of thickness, wherein said film substrate is mainly composed of a polycarbodiimide copolymer having a structure represented by the formula (I) below:

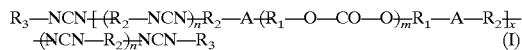
(I)

wherein m represents an integer of 2–50; n represents an integer of 1–30; x represents an integer of 1–10; A represents a urethane bond; $R_1$ represents an alkylene group; $R_2$ represents an aromatic diisocyanate residue; and $R_3$ represents an aromatic monoisocyanate residue.

2. The anisotropic conductive film of claim 1, wherein the polycarbodiimide copolymer has a glass transition temperature of 50–150° C.

3. The anisotropic conductive film of claim 2, which is used for mounting an electronic component, and which is disposed between an electronic component and a circuit board and bonded to allow adhesion to the both by thermal compression, so that said electronic component and the circuit board are mechanically and electrically connected.

4. The anisotropic conductive film of claim 1, wherein, in the formula (I), the alkylene group represented by $R_1$ is a hexamethylene group, the aromatic diisocyanate residue represented by $R_2$ is a tolylene diisocyanate residue, and the aromatic monoisocyanate residue represented by $R_3$ is a p-isopropylphenyl isocyanate residue.

5. The anisotropic conductive film of claim 4, which is used for mounting an electronic component, and which is disposed between an electronic component and a circuit board and bonded to allow adhesion to the both by thermal compression, so that said electronic component and the circuit board are mechanically and electrically connected.

6. The anisotropic conductive film of claim 1, which is used for mounting an electronic component, and which is disposed between an electronic component and a circuit board and bonded to allow adhesion to the both by thermal compression, so that said electronic component and the circuit board are mechanically and electrically connected.

7. An anisotropic conductive film comprising a film substrate made of an insulating resin and a plurality of conductive paths insulated from each other and penetrating the film substrate in the direction of thickness, wherein said film substrate is mainly composed of a setting product of a polycarbodiimide copolymer having a structure represented by the formula (I) below:

(I)

wherein m represents an integer of 2–50; n represents an integer of 1–30; x represents an integer of 1–10; A represents a urethane bond; $R_1$ represents an alkylene group; $R_2$ represents an aromatic diisocyanate residue; and $R_3$ represents an aromatic monoisocyanate residue.

8. The anisotropic conductive film of claim 7, wherein the polycarbodiimide copolymer setting product has a glass transition temperature of 150–250° C.

9. The anisotropic conductive film of claim 8, which is used for functional testing of an electronic component, and which is inserted between the electronic component and a circuit board and adhered to the both by compression, so that said electronic component and the circuit board are testably conducted with each other.

10. The anisotropic conductive film of claim 7, wherein, in the formula (I), the alkylene group represented by $R_1$ is a hexamethylene group, the aromatic diisocyanate residue represented by $R_2$ is a tolylene diisocyanate residue, and the aromatic monoisocyanate residue represented by $R_3$ is a p-isopropylphenyl isocyanate residue.

11. The anisotropic conductive film of claim 10, which is used for functional testing of an electronic component, and which is inserted between the electronic component and a circuit board and adhered to the both by compression, so that said electronic component and the circuit board are testably conducted with each other.

12. The anisotropic conductive film of claim 7, wherein the film as a whole has an elastic modulus of 1 to 1000 MPa at 150° C. to 250° C.

13. The anisotropic conductive film of claim 12, which is used for functional testing of an electronic component, and which is inserted between the electronic component and a circuit board and adhered to the both by compression, so that said electronic component and the circuit board are testably conducted with each other.

14. The anisotropic conductive film of claim 7, which is used for functional testing of an electronic component, and which is inserted between the electronic component and a circuit board and adhered to the both by compression, so that said electronic component and the circuit board are testably conducted with each other.

* * * * *